HIGH POWER SOLID STATE PULSE GENERATOR WITH VERY SHORT RISE TIME

Filed Sept. 5, 1963 2 Sheets-Sheet 1

INVENTORS:
HEINZ RAILLARD,
HANS R. SCHINDLER,
BY Marvin L. Goldenberg
THEIR ATTORNEY.

INVENTORS:
HEINZ RAILLARD,
HANS R. SCHINDLER,
BY Marvin L. Goldenberg
THEIR ATTORNEY.

United States Patent Office 3,385,982
Patented May 28, 1968

3,385,982

HIGH POWER SOLID STATE PULSE GENERATOR WITH VERY SHORT RISE TIME

Heinz Raillard, Liverpool, and Hans R. Schindler, Syracuse, N.Y., assignors to General Electric Company, a corporation of New York Filed Sept. 3, 1963, Ser. No. 306,187
8 Claims. (Cl. 307—319)

This invention relates to pulse generator circuits, and in particular to a novel solid state pulse generator circuit employing a plurality of charge storage diodes for generating relatively high power output pulses of exceedingly short rise-times.

The generation of pulses having very short rise times, on the order of fractions of a nanosecond, find applicatio in much of the present day high frequency electronic equipment. To name but a few, high speed computers of various types, sampling oscilloscopes and advanced radar systems may require pulses of this nature to perform sampling, gating and other functions of high time resolution accuracy.

Known circuits of the prior art capable of generating pulses having rise-times of the order under consideration each have inherent limitations and are useful therefore to but a limited extent. For example, mechanical switches using mercury wetted contacts have been known to provide output pulses having a step rise-time on the order of .2 nanosecond. The repetition rate of these pulses is limited by the mechanical structure of the contacts to a maximum frequency of a few hundred cycles per second. In addition, the generated wave front has considerable time jitter.

Rise-times of electronically generated pulses of less than one nanosecond have been achieved with avalanche transistors using the negative resistance region of the transistors in the breakdown mode. Because of recovery time requirements, frequencies in excess of 2 mc. are difficult to achieve. These devices also exhibit considerable time jitter of the generated pulse leading edge.

More recently, charge storage diodes have been employed in the generation of narrow width, fast rise-time pulses. Charge storage diodes, also commonly referred to as snap-off diodes or step recovery diodes, may be characterized as exhibiting an abrupt change in their impedance state from a low to a high value. These diodes are p-n junction devices, the junctions being built with retarding fields for minority carriers so that the charge stored during biasing for forward conduction through the diode is constrained to the vicinity of the junction. With the bias switched to the reverse condition, conduction occurs for a short period of time in the reverse direction as stored charge is removed. The diode remains in a high conductance state during this time, which is termed the storage time. When the stored minority carriers become depleted, an abrupt change in conductance to a low conductance state occurs and the current previously flowing through the diode in this manner may be switched to associated circuit branches. The time in which the abrupt conductance change takes place will be referred to herein as the switching time, which is normally a small fraction of the storage time. A more complete discussion of charge storage diodes and their application may be found in an article entitled "PN Junction Charge Storage Diodes," by J. L. Moll, S. Krakauer and R. Shen appearing in The Proceedings of the IRE, January 1962.

Although charge storage diodes have characteristics which appear to readily lend them to fast rise-time pulse generation applications, this has not been found to be true. The difficulty encountered is that good quality charge storage diodes, i.e., having fast switching times, are also found to have short minority carrier lifetimes and, significantly, short storage times. For good operating efficiency they require drive pulses having comparably short rise-times, on the order of the diode storage times. Drive pulses of this character, at other than very high repetition frequencies, e.g., at below 50 mc., cannot be readily generated by known pulse generating circuitry. In particular, there is no known solid state circuitry which can do this.

The present invention overcomes the above-noted limitations and thus provides improvement in the generation of exceedingly short rise-time pulses and in extending their useful applications. For example, the disclosed circuit can be advantageously employed to generate pulses with rise and fall times on the order of less than .2 nanosecond with exceedingly low phase jitter, less than 10 picoseconds, at repetition rates from a few hundred kilocycles to in excess of 10 megacycles.

Accordingly, it is an object of the present invention to provide a novel generator circuit which generates output step waveforms having very short rise-times.

It is a further object of the present invention to provide a novel pulse generator circuit which generates relatively high power pulses having very short rise-times useful for operation at repetition rates from a few hundred kilocycles to in excess of 10 megacycles.

It is still another object of the present invention to provide a novel solid state pulse generator circuit having characteristics above described which is of low circuit complexity and inexpensive to manufacture.

A still further object of the present invention is to provide a novel solid state pulse generator circuit having the above characteristics which employs charge storage diodes.

Briefly, these as well as other objects of the invention are achieved in one exemplary circuit embodiment which employs a pair of cascaded charge storage diodes in combination with a current source supplying a periodic step waveform of relatively long rise-times. The first charge storage diode is constructed to have a given relatively long minority carrier lifetime, and for a given applied forward bias current exhibits a relatively long storage time, on the order of the rise-time of the source generated current step, and an accompanying relatively slow switching action. The second charge storage diode is constructed to have a minority carrier lifetime appreciably shorter than that of said first diode, and for a given applied forward bias current exhibits a relatively short storage time, on the order of the switching time of said first diode, and an accompanying fast switching action. Initially, the charge storage diodes have charge stored therein as a result of forward bias current flowing. The current step from said source is applied to the first diode in its reverse direction, the impedance state of the diode remaining low. When the applied current rises to its peak amplitude the diode switches to its high impedance state and the current step generated by this action is applied to the second diode and causes conduction in the reverse direction during a low impedance state of said second diode. When the current step generated by the first diode reaches its peak value the second diode switches to its high impedance state and an exceedingly short rise-time current pulse is thereby generated which may be applied to a load in parallel with said second diode.

While the specification concludes with claims particularly pointing out and distinctly claiming the invention, it is believed that the invention will be better understood from the following description taken in connection with the accompanying drawings in which:

Figure 1:
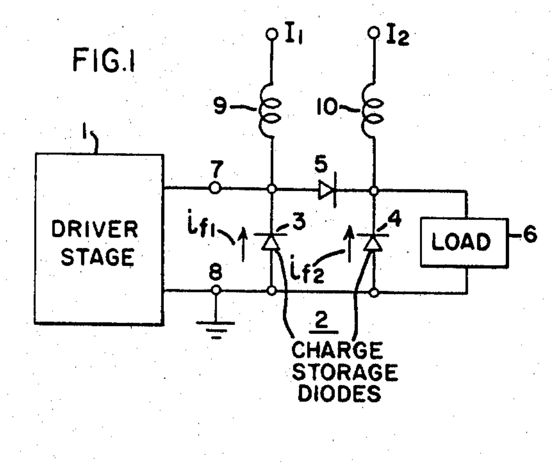
FIGURE 1 is a simplified schematic diagram of a pulse generator circuit constructed in accordance with the invention.

Reference is now made to FIGURE 1 which illustrates a simplified schematic diagram of a pulse generator circuit constructed and operated in accordance with the invention. The circuit is referred to primarily for obtaining an understanding of the basic principles of operation underlying the invention. A more detailed and comprehensive illustration of the invention is presented in FIGURE 3, which will be described presently.

In FIGURE 1 a driver stage 1, ideally a current source, applies a series of input current steps or pulses to a charge storage diode network 2 comprising a plurality of cascaded charge storage diodes 3 and 4 and a gate diode 5. The diode network 2 acts to efficiently translate the input pulses into exceedingly short rise-time pulses, on the order of .2 nanosecond, applied to a load 6.

Driver state 1 includes output terminals 7 and 8, the latter being connected to ground. The first charge storage diode 3 is coupled between terminals 7 and 8, its anode being connected to grounded terminal 8 and its cathode connected to terminal 7. The cathode of diode 3 is also connected through an RF choke coil 9 to a DC bias current source $I_1$ which supplies forward drive current $i_{f1}$ through diode 3. Diode 3 has a relatively long minority carrier lifetime and exhibits relatively slow storage and switching times, for reasons to be discussed subsequently. Gate diode 5, poled to conduct positive current away from terminal 7, is connected between the cathode of diode 3 and the cathode of charge storage diode 4, the anode of diode 4 being connected to ground.The cathode of diode 4 is also coupled through an RF choke coil 10 to a DC bias current source $I_2$ which supplies a forward drive current $i_{f2}$ through diode 4. Load 6 is connected in shunt with the diode 4. Charge storage diode 4 has a relatively short minority carrier lifetime and exhibits relatively fast storage and switching times, as will be seen.

Before describing operation of the circuit of FIGURE 1 the following considerations will be treated to provide a better understanding of the circuit.

The stored charge $q$ in a semiconductor diode as a function of current and time may be expressed as:

$$\frac{dq}{dt}=i-\frac{q}{\tau} \qquad (1)$$

where $i$ is the forward diode current and $\tau$ is the minority carrier lifetime. The quiescent charge stored when a forward bias current $i$ is applied is readily found by setting $dq/dt$ equal to zero in Equation 1. Then the equiescent stored charge $q_0$ may be calculated as:

$$q_0=i\tau \qquad (2)$$

When a reverse current is applied to a charge storage diode, $q$ will reduce to zero during a period of high diode conductance which is the storage time, whereupon the current flow through the diode ceases abruptly. This abrupt change in the conductance characteristic of the diode may be usefully employed for performing rapid current switching, whereby the current is suddenly directed into a shunt load.

Figures 2A, 2B, 2C:
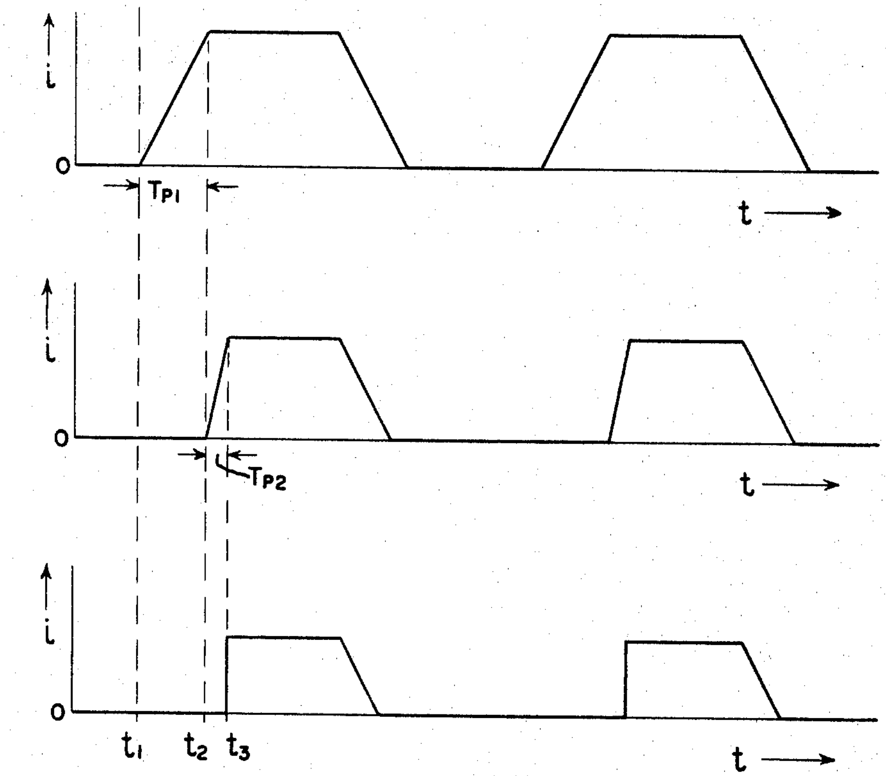
FIGURES 2A, 2B and 2C are graphs of current waveforms appearing at various points in the circuit of FIGURE 1 which are employed in describing said circuit.

If we assure a current ramp of finite rise-time $T_p$ to be applied to the diode, e.g., see FIGURE 2A, the diode current follows the ramp current until the charge $q$ is removed whereupon diode conduction essentially ceases and an abrupt current step is generated in the shunt load. For optimum operation, two conditions must be met. Condition ONE is that the storage time of the diode be at least as great as $T_p$. By satisfying this condition is is ensured that the current step generated in the load has an amplitude equal to the maximum possible reverse namely $i_r$. Condition TWO is that the ratio $i_r/(i_f+i_r)$ be maximized which provides maximum efficiency of operation. To satisfy this condition $i_f$ is made as small as possible. It may be noted with respect to the above that the two conditions are somewhat in conflict since condition TWO is compatible and condition ONE is incompatible with minimum switching times for charge storage diodes, it being recognized that minimum switching times are necessary for generating exceedingly short rise-time pulses.

The diode charge $q$, under practical drive conditions of a ramp current waveform may be computed by solving Equation 1 under the initial condition expressed in Equation 2 and letting the drive current $i$ be expressed as follows:

$$i=i_f-(i_f+i_r)\frac{t}{T_p} \qquad (3)$$

(3)

for $0 \leq t \leq T_p$

The solution referenced to the quiescent charge $q_0$ is computed to be:

$$\frac{q}{q_0}=\left[1-\left(\frac{i_f+i_r}{f}\right)\cdot\frac{\tau}{T_p}\cdot\left(e-\frac{t}{\tau}+\frac{t}{\tau}-1\right)\right] \qquad (4)$$

In order to meet condition ONE, the charge $q$ must become depleted at $t \geq T_p$. The time for charge $q$ to reach zero is denoted by $t_s$, and it is equal to the storage time plus the rapid switching time. By setting $q$ equal to zero in Equation 4, $t_s$ may be solved for, and for this condition $t_s \geq T_p$ one may obtain the expression:

$$\frac{i_r}{i_f+i_r}\leq\frac{\tau}{T_p}\left(1-e-\frac{T_p}{\tau}\right) \qquad (5)$$

which for $\tau/T_p >> 1$ reduces to:

$$\frac{i_r}{i_f+i_r}\leq\left(1-1/2\frac{T_p}{\tau}\right) \qquad (6)$$

The equality sign in expression (5) and (6) holds when $t_s=T_p$. It is seen that expressions (5) and (6) have been derived assuming condition ONE is met. From expression (6) it may be readily seen that the condition TWO is met, namely maximizing the ratio $i_r/(i_f+i_r)$, if the ratio of input pulse rise-time $T_p$ to minority carrier lifetime $\tau$ is made minimum. Accordingly, to meet condition TWO there must be employed either charge storage diodes of long carrier lifetimes or, alternatively, short rise-time drive pulses. However, charge storage diodes of long carrier lifetimes have been found to exhibit slow switching action, resulting in generated pulses of relatively poor rise-times. On the other hand, the generation of drive pulses of sufficiently short rise-times for driving fast switching charge storage diodes is not feasible in the present state of the art.

In the circuit of FIGURE 1, charge storage diode 3, of relatively long minority carrier lifetime $\tau_1$ (and, therefore, long storage and switching times) is employed to drive charge storage diode 4, of relatively short carrier lifetime $\tau_2$ (and, therefore, short storage and switching times), and the above-noted conditions ONE and TWO are readily met for providing good efficiency of operation.

The operation of FIGURE 1 will now be considered. In the absence of a pulse from driver stage 1, forward current $i_{f1}$ flows in the diode 3 in the direction indicated by the arrow due to the bias source $I_1$. Forward current $i_{f2}$ flows through diode 4 in the direction indicated by the arrow due to bias source $I_2$. Essentially no current flows through the load 6 because of the relatively low impedance paths provided by diodes 3 and 4. At time $t_1$ it is assumed that a drive pulse is applied from driver stage 1 to charge storage diode 3, the drive pulse exhibiting a current ramp having a rise-time of $T_{p1}$ as shown in FIGURE 2A. The rise-time $T_{p1}$ is shown as extending between $t_1$ and $t_2$. It is noted that for purposes of explanation an ideal current ramp is assumed with the rise-time extending from the bottom to the top of the ramp. In practice, however, the rise-time is assumed to extend from 10% to 90% of current build up. The storage time of diode 3, being relatively long, is equal to or slightly exceeds the rise-time $T_{p1}$ of the applied pulse so that the peak of the applied pulse is reached before switching of the impedance state of the diode occurs. It is therefore seen that condition ONE is met. Thus, the diode current will follow the applied ramp current to its peak, after which switching occurs. In addition, the diode is characterized in having a carrier lifetime $\tau_1$ that is considerably greater than the pulse rise-time $T_{p1}$ so that the forward drive current $i_{f1}$ may be made as small as possible, and condition TWO is also met. In the optimum operation, switching of the impedance state of diode 3 occurs at $t_2$, or slightly beyond. It is noted that before switching of diode 3 occurs the drive pulse is inhibited from the path containing charge storage diode 4 by gate diode 5 which is in a back biased condition.

When switching occurs, a current pulse is generated by diode 3 and applied through gate diode 5, now forward biased, to charge storage diode 4. The generated current pulse has a rise-time approximately equal to the switching time of diode 3, and its waveform is shown in FIGURE 2B. The peak amplitude of the current waveform of FIGURE 2B may be appreciated to be less than that of FIGURE 2A by an amount equal to the forward bias current of diode 3. Accordingly, before diode 3 switches forward current $i_{f2}$ flows through diode 4. It is noted that $i_{f2}$ is made less than $i_{f1}$. The pulse applied to charge storage diode 4 starts at approximately $t_2$, the pulse having a rise-time $T_{p2}$ which is said to be approximately equal to the switching time of diode 3. The rise-time $T_{p2}$ extends between $t_2$ and $t_3$. The rise-time $T_{p2}$ is equal to or slightly less than the storage time of diode 4 so that condition ONE is again met. It is noted that the storage time of diode 4 is considerably less than the storage time of diode 3. With respect to the second condition, the carrier lifetime $\tau_2$ of charge storage diode 4 is considerably greater than the rise-time $T_{p2}$, the ratio of $T_{p2}/\tau_2$ being approximately equal to $T_{p1}/\tau_1$. However, because $T_{p2}$ is appreciably less than $T_{p1}$, $\tau_2$ is appreciably less than $\tau_1$. Therefore, it is seen that condition TWO may be met in diode 4 by employing a diode of a characteristically shorter minority carrier lifetime, i.e., a fast switching charge storage diode.

At time $t_3$ switching occurs in charge storage diode 4 providing a current pulse to load 6 having an exceedingly short rise-time, the waveform being shown in FIGURE 2C. The peak amplitude of the waveform of FIGURE 2C is less than that of FIGURE 2B by an amount equal to the forward bias current of diode 4.

It may be noted that in addition to charge storage diodes other semiconductor diodes having charge storage properties and exhibiting an abrupt transition from the reverse conducting state to the reverse blocking state after forward bias current is applied may be employed in the circuitry of the present invention. Thus, various types of varactor or parametic diodes, computer diodes, rectifier diodes, etc., which have rapid switching times, on the order of a nanosecond, may be suitable.

Figures 3, 4A, 4B, 4C, 4D, 4E, 4F:
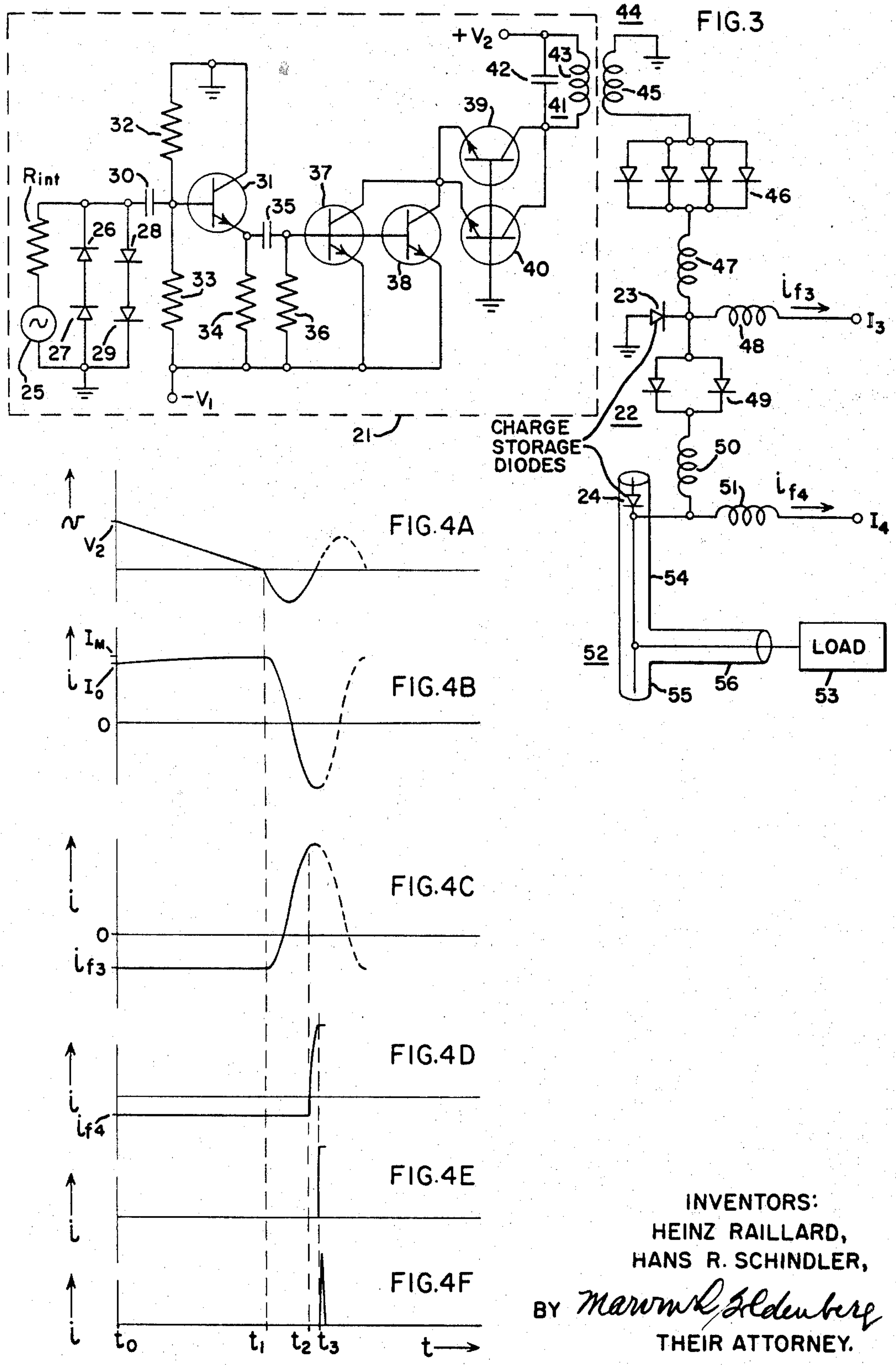
FIGURE 3 is a detailed schematic diagram of a pulse generator circuit in accordance with the invention.
FIGURES 4A, 4B, 4C, 4D, 4E are graphs of current and voltage waveforms appearing at various points in the circuit of FIGURE 3 which are empolyed in describing said circuit.

Reference is now made to FIGURE 3 illustrating in detail a preferred operating embodiment of the present invention. A pulse generating driver stage 21, functioning essentially as a current source, supplies drive pulses to a charge storage diode network 22 which includes charge storage diodes 23 and 24, similar in their characteristics to charge storage diodes 3 and 4, respectively, of FIGURE 1. Driver stage 21 includes a sinusoidal generator 25 having a frequency typically on the order of 5 to 10 megacycles. Generator 25 referenced to ground and of internal resistance $R_{int}$ is coupled across diodes 26, 27, 28 and 29 and through a DC blocking capacitor 30 to the input of transistor 31 of a first amplifier stage. Diodes 26 and 27 are serially connected and poled in the same direction, the anode of diode 27 being coupled to ground and the cathode of diode 26 being coupled to the ungrounded terminal of generator 25. Diodes 28 and 29 are serially connected between the ungrounded terminal of generator 25 and ground in shunt with the first diode pair 26 and 27, and poled in a direction opposite to that of the first diode pair. Diodes 26 through 29 act as limiters and provide a square wave input to transistor 31, the peak to peak amplitude of the square wave being determined by the voltage drop across each diode pair in the forward conducting state. The DC blocking capacitor 30 is connected between the junction of the cathode of diode 26 and the anode of diode 28 and the base electrode of transistor 31. Also coupled to the base electrode of transistor 31 are biasing resistors 32 and 33 connected to ground and a negative DC bias source $-V_1$, respectively. The collector electrode of transistor 31 is connected to ground and the emitter electrode is connected through a loading resistor 34 to bias source $-V_1$. Transistor 31 and its associated circuitry is thus seen to be an emitter follower type amplifier.

The emitter electrode of transistor 31 is also coupled by a capacitor 35 and a biasing resistor 36 to the input of a second amplifier stage including transistors 37 and 38, one terminal of resistor 36 being coupled to source $-V_1$ and the opposite terminal of resistor 36 forming a junction with capacitor 35 being coupled to the base electrodes of transistors 37 and 38. Transistors 37 and 38 are coupled in parallel and provide amplification of the signal from the emitter follower amplifier. The emitter electrodes of transistors 37 and 38 are coupled to source $-V_1$ and the collector electrodes are coupled to the junction of the emitter electrodes of isolating transistors 39 and 40, which transistors are coupled in parallel. The base electrodes of transistors 39 and 40 are commonly connected to ground, and the collector electrodes are joined together and connected to one terminal of an LC network 41 including capacitor 42 and inductor 43 connected in parallel. The opposite terminal of LC network 41 is connected to a positive DC bias source $+V_2$.

Inductor 43 forms the primary winding of a transformer 44 having a secondary winding 45. One terminal of secondary winding 45 is connected to ground. The opposite terminal is connected through a plurality of four parallel gate diodes 46 and a serially coupled inductor 47 to the cathode of a first charge storage diode 23, the anode thereof being tied to ground. Inductor 47 has an inductance value considerably lower than the inductance of windows 43 and 45 for reasons to be explained presently. Gate diodes 46 are poled so as to conduct current from winding 45 to diode 23. The cathode of diode 23 is also connected through an RF choke coil 48 to a DC bias current source $I_3$ supplying forward bias current $i_{f3}$ through diode 23, and through shunt coupled gate diodes 49 and a second serially coupled inductor 50 to the cathode of a second charge storage diode 24. The inductance of inductor 50 is slightly less than that of inductor 47, as will be seen. The anode of diode 24 is connected to ground. The cathode of diode 24 is also connected through an RF choke coil 51 to a second DC bias current source $I_4$ supplying forward bias current $i_{f4}$ through diode 24, and through a coaxial transmission line 52 to a load 53. Transmission line 52 is a form of T hybrid and includes input branch 54 connected to a common junction to output branches 55 and 56, branch 55 having a reflective termination and branch 56 being coupled to load 53.

In the operation of the circuit of FIGURE 3, transistors 31 and 37 to 40 conduct in a saturated mode during the positive half cycles of the applied input square wave and become nonconducting during the negative half cycles, the square waveform of the input providing a rapid turn-on and turn-off of the transistors. Under the application of a positive half cycle of the input waveform causing conduction of the transistors, the capacitor 42 charges to essentially the full voltage provided by source $+V_2$. During this period current builds up in inductor 43 in accordance with the relationship of $$e=L\frac{di}{dt}$$

where $e$ is the voltage across the capacitor 42. The voltage across capacitor 42 is shown in FIGURE 4A, indicated as being equal to $V_2$ at time $t_0$, essentially at the end of the conduction period. The current through inductor 43 is shown in FIGURE 4B, being equal to $I_0$, at time $t_0$. As the transistors are rapidly turned off by application of the negative half cycle of the input waveform, the capacitor begins to discharge. As illustrated in FIGURES 4A and 4B, for a time interval the current through inductor 43 continues its build up, at a decreasing rate, until at time $t_1$ the capacitor voltage reduces to zero and the inductor current reaches a maximum at $I_m$. Until $t_1$ the current flowing through inductor 43 induces a voltage in secondary winding 44 of a negative polarity which back biases gate diodes 46 and current flow is blocked in the secondary circuit. During this period forward bias current $i_{f3}$ and $i_{f4}$ is conducted through charge storage diodes 23 and 24, as is illustrated in FIGURES 4C and 4D. Since current in inductor 43 cannot change instantaneously flow continues and capacitor 42 begins to charge in a direction opposite to its original charge and the current through inductor 43 commences to decrease. The reduction in current generates an induced voltage in secondary winding 44 of a positive polarity to forward bias gate diodes 46. At a time immediately subsequent to $t_1$, current in the secondary circuit flows from the high voltage terminal of winding 45, through gate diodes 46, inductor 47 and charge storage diode 23 to ground. Gate diodes 49 remain nonconducting. A current step, shown in FIGURE 4C, develops through diode 23, conducting in the backward direction. In this state of operation the series connection of inductor 47 and charge storage diode 23 is effectively coupled in parallel with capacitor 42, with the major portion of the voltage of capacitor 42 impressed across inductor 47, since diode 23 is in a low impedance condition. The time constants of the circuit change at time $t_1$ with inductor 47 now effectively resonating with capacitor 42, as indicated by the discontinuity in the voltage and current waveforms of FIGURES 4A and 4B. Current develops in inductor 47 having a peak value equal to about two times $I_m$ as indicated by comparing the waveforms of FIGURES 4B and 4C. The waveforms of FIGURES 4A, 4B and 4C are shown dotted beyond about time $t_2$ because the circuit characteristics again change when diode 23 switches to its high impedance state.

The rise-time of the current step of FIGURE 1C may be appreciated to be principally a function of the inductance of inductor 47 and the voltage thereacross. The indicated rise-time should be approximately equal to or slightly less than the storage time of diode 23 and substantially less than the minority carrier lifetime of diode 23, for reasons discussed with respect to FIGURE 1. Therefore, at approximately the time when the current through inductor 47 reaches its peak value, time $t_2$, the diode switches to its high impedance state, also a high voltage state, and the current is switched through gate diodes 49 which are now biased for conduction. For this condition of operation the series connection of inductor 50 and charge storage diode 24 is effectively coupled in parallel with charge storage diode 23, and the major portion of the voltage of diode 23 is impressed across inductor 50. The current builds up exceedingly rapidly in inductor 50, which has an inductance value less than inductor 47, and is conducted through charge storage diode 24 in the backward direction. The current step developed through diode 24, illustrated in FIGURE 4D, has a rise-time approximately equal to or slightly less than the storage time of diode 24 and much less than the diode minority carrier lifetime. At approximately the time when the current through inductor 50 reaches a peak value, time $t_3$, the diode 24 switches to its high impedance state and the current is switched through the transmission line 52 to load 53. The current step generated by diode 24 is shown in FIGURE 4E. This current step will occur at precisely the same point in time with respect to each cycle of this applied input waveform so that time jitter of the circuit is very low, e.g., within 10 picoseconds.

At some time shortly after the diode 24 switches to its high impedance state, the positive half cycle of the input waveform causes the transistors to once more conduct and the process is repeated.

It can be seen that inductor 47, which has an inductance value $L_1$ sufficiently low to provide current build-up commensurate with the storage time of diodes 23, serves two primary functions. It provides isolation between charge storage diode 23 and capacitor 42 so that diode 23 can rapidly switch its voltage state independent of the voltage across capacitor 42. In addition, it maintains a high value of current after switching occurs in diode 23. The inductor 50 has a sufficiently low inductance value $L_2$ to permit a rapid current build-up commensurate with the storage time of diode 24. It also serves to provide isolation between diode 24 and diode 23 so that a rapid switching action can occur in diode 24 independent of the voltage condition across diode 23. Further, the inductances $L_1$ and $L_2$ are high enough so that the time constant $(L_1+L_2)/R$, where R is the load resistance, is substantially greater than the switching time of the diode 24, thereby maintaining a high current value after switching of diode 24 for application to the load.

The current step generated by charge storage diode 24 is converted into a current pulse of exceedingly fast rise and fall times in transmission line 52. The current step is thus conducted by the branch 54 to the junction at which point the power splits, half going out branch 56 and half out branch 55. The portion in branch 55 is inverted and reflected back to the junction. The reflective termination is spaced from the junction by about 0.15 nanosecond so that the reflected energy appears at the junction with a .3 nanosecond delay. The reflected and incident energies are algebraically added to form a narrow discrete current pulse through branch 56 to load 53, as shown in FIGURE 4F. Although not illustrated, it is desirable to insert an attenuator of conventional type providing about a 3 db attenuation in branch 54 to reduce base line noise in the output waveform. Further, the output pulse width may be readily varied by providing a variation in the length of output branch 55.

In one operating embodiment the following components and circuit values, which are merely exemplary and not to be construed as limiting, were employed in the circuit of FIGURE 3:

| | |
|---|---|
| Generator **25** | 5–10 mc., 8 v. peak to peak. |
| $R_{int}$ | 50 ohms. |
| Diodes **26** through **29** | Type MA450 C. |
| Diode **23** | Type SSA550, $\tau \cong 70$ nanoseconds. |
| Diode **24** | Type SSD558, $\tau \cong 5$ nanoseconds. |
| Diodes **46** and **49** | Type FD100. |
| Resistor **32** | 300 ohms. |
| Resistor **33** | 390 ohms. |
| Resistor **34** | 100 ohms. |
| Resistor **36** | 200 ohms. |
| Capacitor **30** | 2nf. |
| Capacitor **35** | .1 $\mu$f. |
| Capacitor **42** | 40 pf. |
| Transistors **31**, **37** and **38** | 2N 2219. |
| Transistors **39** and **40** | Type 2N 2087. |
| Transformer **44** | G.E. CQ 76 core, 1:1 turns ratio. |
| Inductors **43** and **45** | 2.3 $\mu$h. |
| Inductor **47** | 50 nh. |
| Inductor **50** | 20 nh. |
| Inductors **48** and **51** | 100 $\mu$h. |
| Load **53** | 50 ohms. |
| Peak output pulse current | .14 amps for pulse width at base of 1 nanosecond. |
| DC source $-V_1$ | $-10$ v. |
| DC source $+V_2$ | $+15$ v. |
| Source $I_3$ | provides bias current of 180 ma. |
| Source $I_4$ | provides bias current of 100 ma. |

In the operation of the circuit employing the above recited components the rise-time of the current step applied to charge storage diode 23 was approximately 7 nanoseconds, which is seen to be considerably shorter than the diode carrier lifetime of 70 nanoseconds. The rise-time of the current step applied to the charge storage diode 24 was approximately 1 nanosecond, appreciably shorter than the diode carrier lifetime of 5 nanoseconds. As has been adverted to, the switching time of diode 24 was approximately .2 nanosecond.

Although the invention has been described with respect to a concrete operating embodiment, it should be recognized that the invention is not intended to be thus limited. Numerous modifications may be made to the disclosed circuitry by workers skilled in the art which do not exceed the basic concept of the invention. For example, although two cascaded charge storage diodes are illustrated, more than two may be usefully employed using the principles herein set forth should the characteristics of charge storage diodes be further improved in the future, i.e., faster switching times developed. Further, the biasing circuits for the diodes need not include separate biasing sources, shown herein principally for ease of explanation. Thus, the disclosed current sources $I_1$ to $I_4$ may each be replaced by a simple resistor of appropriate value which together with the choke coils shown can provide the necessary forward bias currents. In addition, the transformer of FIGURE 3 may be replaced by a single inductor with no essential difference in circuit performance. The advantage of using a transformer is that both negative and positive step-voltages and pulses can be generated. Whereas the circuit of FIGURE 3 is for a positive ramp, a negative ramp may be achieved by reversing the terminals of secondary winding 45, the diodes 23, 24, 46 and 49 and reversing the bias currents $i_{f3}$ and $i_{f4}$.

The appended claims are to be construed as embracing the basic invention herein set forth including any and all modifications falling within the invention's true scope and spirit.

What we claim as new and desire to secure by Letters Patent of the United States is:

1. An electrical circuit for generating energy in the form of an output step wave of very short rise-time comprising:

(a) a first semiconductor diode exhibiting characteristics of charge storage and abrupt switching from its low impedance to its high impedance state and constructed to have a given minority carrier lifetime, (b) a second semiconductor diode exhibiting characteristics of charge storage and abrupt switching from its low impedance to its high impedance state and constructed to have a minority carrier lifetime appreciably shorter than said given lifetime, (c) circuit means for coupling said first and second diodes in parallel paths in a cascaded relationship, (d) output means connected in shunt with said second diode, (e) biasing circuitry for conducting forward bias currents through said diodes so as to store minority carriers therein and providing a storage time for said first diode appreciably greater than the storage time for said second diode, said diodes being in a low impedance state and supporting easy current flow in the backward direction during their respective storage times, (f) energization means for applying input energy to said first diode in the form of a step wave of a polarity to direct current through said first diode in the backward direction, the rise-time of the applied step wave being on the order of said first diode storage time and appreciably less than said given minority carrier lifetime, switching of the first diode to a high impedance state upon termination of the storage time thereof providing generation and application to the second diode of a step wave having a rise-time on the order of said second diode storage time and appreciably less than said second diode minority carrier lifetime whereby switching of said second diode to a high impedance state upon termination of the storage time thereof provides generation of said output step wave of very short rise-time.

2. An electrical circuit as in claim 1 wherein said circuit means includes gating means coupled between said first and second diodes for providing a high impedance connection between said diodes before switching of said first diode to a high impedance state and a low impedance connection after switching of said first diode to a high impedance state.

3. An electrical circuit as in claim 2 wherein said circuit means includes a low inductance element coupled between said first and second diodes in series with said gating means.

4. An electrical circuit for generating energy in the form of an output step wave of very short rise-time comprising:

(a) a first semiconductor diode exhibiting characteristics of charge storage and abrupt switching from its low impedance to its high impedance state and constructed to have a given minority lifetime, (b) a second semiconductor diode exhibiting characteristics of charge storage and abrupt switching from its low impedance to its high impedance state and constructed to have a minority carrier lifetime appreciably shorter than said given lifetime, (c) circuit means for coupling said first and second diodes in parallel paths in a cascaded relationship, (d) output means connected in shunt with said second diode, (e) biasing circuitry for conducting forward bias currents through said diodes so as to store minority carriers therein and providing a storage time for said first diode appreciably greater than the storage time for said second diode, said diodes being in a low impedance state and supporting easy current flow in the backward direction during their respective storage times, (f) a driver circuit including transistor switching means for generating input energy for application to said diodes, (g) means for applying said input energy to said first diode in the form of a step wave of a polarity to direct current through said first diode in the backward direciton, the rise-time of the applied step wave being on the order of said first diode storage time and appreciably less than said given minority carrier lifetime, switching of the first diode to a high impedance state upon termination of the storage time thereof providing generation and application to the second diode of a step wave having a rise-time on the order of said second diode storage time and appreciably less than said second diode minority carrier lifetime whereby switching of said second diode to a high impedance state upon termination of the storage time thereof provides generation of said output step wave of very short rise-time.

5. An electrical circuit as in claim 4 wherein said circuit means includes gating means coupled between said first and second diodes for providing a high impedance connection between said diodes before switching of said first diode to a high impedance state and a low impedance connection after switching of said first diode to a high impedance state.

6. An electrical circuit as in claim 5 wherein said driver circuit includes an inductance element connected in series relationship with said transistor switching means, said switching means selectively coupling a source of voltage across said inductance element, means for coupling the path containing said first diode effectively in parallel with said inductance element whereupon current developed in said inductance element during conduction of said transistor switching means becomes a source of current for said first diode upon nonconduction of said switching means.

7. An electrical circuit as in claim 5 wherein said driver circuit includes a tuned circuit of a parallel coupled inductance and capacitance connected in series relationship with said transistor switching means, means including a transformer for coupling the path containing said first diode effectively in parallel with said tuned circuit whereupon current developed in said tuned circuit during conduction of said transistor switching means becomes a source of current for said first diode upon nonconduction of said switching means.

8. An electrical circuit as in claim 7 wherein the paths containing said first and second diodes each include a low inductance element.

References Cited

UNITED STATES PATENTS 3,200,267 8/1965 Cubert ------------ 307—88.5

JOHN S. HEYMAN, *Primary Examiner.*

ARTHUR GAUSS, *Examiner.*

R. EPSTEIN, J. ZAZWORSKY, *Assistant Examiners.*